United States Patent
Lukanc et al.

(10) Patent No.: US 7,543,256 B1
(45) Date of Patent: Jun. 2, 2009

(54) SYSTEM AND METHOD FOR DESIGNING AN INTEGRATED CIRCUIT DEVICE

(75) Inventors: Todd P. Lukanc, San Jose, CA (US);
Cyrus E. Tabery, Santa Clara, CA (US);
Luigi Capodieci, Santa Cruz, CA (US);
Carl Babcock, Campbell, CA (US);
Hung-Eil Kim, San Jose, CA (US);
Christopher A. Spence, Sunnyvale, CA (US); Chris Haidinyak, Santa Cruz, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 1034 days.

(21) Appl. No.: 10/790,590

(22) Filed: Mar. 1, 2004

(51) Int. Cl.
G06F 17/50 (2006.01)
(52) U.S. Cl. .......................................... 716/5
(58) Field of Classification Search ............... 712/2; 716/2, 4–6, 8–10
See application file for complete search history.

(56) References Cited

U.S. PATENT DOCUMENTS

| | | | |
|---|---|---|---|
| 5,987,086 A * | 11/1999 | Raman et al. | 716/1 |
| 6,415,421 B2 | 7/2002 | Anderson et al. | 716/4 |
| 6,425,113 B1 | 7/2002 | Anderson et al. | 716/5 |
| 6,510,730 B1 | 1/2003 | Phan et al. | 73/105 |
| 6,523,162 B1 | 2/2003 | Agrawal et al. | 716/19 |
| 6,735,742 B2 * | 5/2004 | Hatsch et al. | 716/2 |
| 2002/0140920 A1 * | 10/2002 | Rosenbluth et al. | 355/67 |
| 2003/0229412 A1 * | 12/2003 | White et al. | 700/121 |
| 2003/0229868 A1 * | 12/2003 | White et al. | 716/5 |
| 2003/0237064 A1 * | 12/2003 | White et al. | 716/5 |

* cited by examiner

Primary Examiner—Stacy A Whitmore
(74) Attorney, Agent, or Firm—Winstead P.C.

(57) ABSTRACT

A method includes providing an initial IC device design, which design has a desired set of electrical characteristics. A layout representation corresponding to the initial device design is generated. A simulation tool is used to determine whether the layout representation corresponds to an IC device design having the desired electrical characteristics. In addition, the variation between structures within IC device designed due to process variations is evaluated using the simulation tool. This variation can be used to determine whether the design is optimized.

2 Claims, 5 Drawing Sheets

US 7,543,256 B1

SYSTEM AND METHOD FOR DESIGNING AN INTEGRATED CIRCUIT DEVICE

TECHNICAL FIELD

The present invention relates generally to the field of integrated circuit device design and manufacture and, more particularly, to a system and method for designing an integrated circuit device in which a simulation tool is used to accurately predict variations between structures within the device and to accurately model electrical characteristics of the device.

BACKGROUND

The formation of various integrated circuit (IC) device structures often relies on photolithographic processes or photolithography. Photolithography generally involves selectively exposing regions of a resist-coated silicon wafer to form a radiation pattern thereon. Once exposure is complete, the exposed resist is developed in order to selectively expose and protect the various regions on the silicon wafer defined by the exposure pattern (e.g., silicon regions in the substrate, polysilicon on the substrate, or insulating layers, such as silicon dioxide).

The photolithography or pattern transfer system includes a reticle (or mask), which includes a pattern thereon corresponding to features to be formed in a layer on the substrate. The reticle typically includes a transparent glass plate covered with a patterned light blocking material, such as chrome. The reticle is placed between a radiation source producing radiation of a pre-selected wavelength (e.g., ultraviolet light) and a focusing lens, which may form part of a stepper apparatus. Placed beneath the stepper is the resist-coated silicon wafer. When the radiation from the radiation source is directed onto the reticle, light passes through the glass (in the region not containing the chrome mask patterns) and projects onto the resist-coated silicon wafer. In this manner, an image of the reticle is transferred to the resist.

The resist (sometimes referred to as the "photoresist") is provided as a thin layer of radiation-sensitive material that is typically spin-coated over the entire silicon wafer surface. The resist material can be classified as either positive or negative depending on how it responds to the light radiation. Positive resist, when exposed to radiation, becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle.

There is a pervasive trend in the art of IC design and fabrication to increase the density with which various structures are arranged. For example, line widths and separation between lines is becoming increasingly smaller. With this size reduction, however, various steps within the integrated circuit design and fabrication process become more difficult. For example, the electrical model for an integrated circuit device design is typically defined by simple, predictable structures that are not impacted by corner rounding or proximity to other structures. However, as the demand for smaller scale devices increases, layouts are further optimized and structures are compressed as much as possible. The unfortunate result of this is that the real physical layouts do not match the electrical model characteristics, and therefore, the designs do not behave as predicted and/or desired by the designer.

Further, designers typically use an average value for pattern variations when designing structures within IC devices that are supposed to be the same and/or have a fixed relationship relative one another. For instance, a designer may want one structure within a device to have a fixed relationship to another structure within the device (e.g., device "A" must have at least 10 percent greater gain than device "B"). In this case, the designer typically ends up over guard banding variations between the structures (i.e., designing to a worst case variation).

Accordingly, a need exists in the art for a system and method for designing integrated circuit devices that can accurately model electrical characteristics of the device as well as accurately predict variations between structures within the device.

SUMMARY OF THE INVENTION

According to one aspect of the invention, the invention is directed to a method of designing an integrated circuit (IC) device having desired electrical characteristics. The method can include providing an initial IC device design and generating a layout representation corresponding to the initial IC device design. The method can include simulating how structures within the layout representation will pattern on a wafer. Based on the simulating step, it can be determined whether actual electrical characteristics associated with the initial IC device design sufficiently match the desired electrical characteristics. If the actual electrical characteristics associated with the initial IC device design do not sufficiently match the desired electrical characteristics, the initial IC device design can be modified.

According to another aspect of the invention, the invention is directed to a method of designing an integrated circuit (IC) device. The method can include providing an initial IC device design, generating a layout representation corresponding to the initial IC device design, and determining an amount of process-related variation in how at least a portion of the layout representation will pattern on a wafer.

According to another aspect of the invention, the invention is directed to a computer-implemented method in which an initial integrated circuit (IC) device design is provided. The method can include generating a layout representation corresponding to the initial IC device design and simulating how structures within the layout representation will pattern on a wafer. Based on the simulating step, an amount of process-related variation in how at least a portion of the layout representation will pattern on a wafer can be determined and it can be determined whether the layout representation will pattern as an IC device having desired electrical characteristics.

These and other features of the invention are fully described and particularly pointed out in the claims. The following description and annexed drawings set forth in detail certain illustrative embodiments of the invention, these embodiments being indicative of but a few of the various ways in which the principles of the invention may be employed.

BRIEF DESCRIPTION OF DRAWINGS

These and further features of the present invention will be apparent with reference to the following description and drawings, wherein.

DISCLOSURE OF INVENTION

Figure 1:
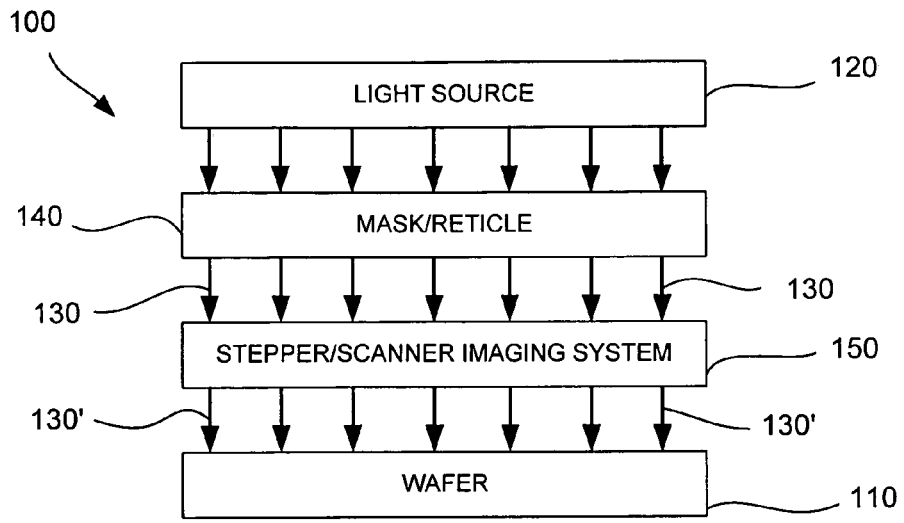
FIG. 1 is a schematic diagram of an exemplary photolithographic processing arrangement.

In the detailed description that follows, corresponding steps have been given reference numerals increasing by increments of one-hundred regardless of whether they are shown in different embodiments of the present invention. To illustrate the present invention in a clear and concise manner, the drawings may not necessarily be to scale and certain features may be shown in somewhat schematic form.

The present invention includes a method of designing an integrated circuit (IC) device using a lithography simulation tool. The simulation tool can simulate a device design layout and determine the actual dimensions of device structures within the layout. This information can be used to determine the actual electrical characteristics associated with the actual dimensions of the device structures. Further, the simulation tool can be used to determine process-related variations between device structures and/or the sizes of device structures. This can provide the designer with an electrical model, which most accurately represents the actual physical layout of the device design, as well as the true process-related variations within the model.

The present invention will be described herein in the exemplary context of a design process for ultimately patterning a layer of silicon (e.g., polysilicon) that forms a part an IC device. Exemplary IC devices can include general use processors made from thousands or millions of transistors, a flash memory array or any other dedicated circuitry. However, one skilled in the art will appreciate that the methods and systems described herein can also be applied to the design process and/or manufacture of any article manufactured using photolithography, such as micromachines, disk drive heads, gene chips, microelectro-mechanical systems (MEMS) and so forth.

With reference to FIG. 1, an exemplary photolithographic processing arrangement for manufacturing or otherwise processing integrated circuit (IC) devices designed in accordance with the present invention is provided. The processing arrangement can include an optical system 100 used to image a pattern onto a wafer 110. The general arrangement of the optical system 100 is relatively well known in the art and will not be described in great detail. The optical system 100 can include a light source 120 for directing light or other actinic energy 130 of a pre-determined wavelength toward a mask or reticle 140. The light energy 130 can be, for example, partially coherent light. An exemplary wavelength for the light energy 130 can be about 193 nm, as produced by an argon-fluoride laser. The optical system 100 can be arranged such that the light energy 130 can be used to produce IC nodes on the wafer 110 having a critical dimension (CD) of, for example, 130 nm, 100 nm, 65 nm and so forth. It is also contemplated that other wavelengths, such as 157 nm and extreme-ultraviolet wavelengths, can also be used to produce even smaller CDs, such as 45 nm.

The reticle 140 blocks light energy 130 from certain pre-determined portions of the wafer 110 such that a light pattern 130' defined by the reticle layout is transferred to the wafer 110. A stepper/scanner imaging system 150 sequentially directs the light pattern 130' transmitted by the reticle 140 to a series of desired locations on the wafer 110.

Figure 2:
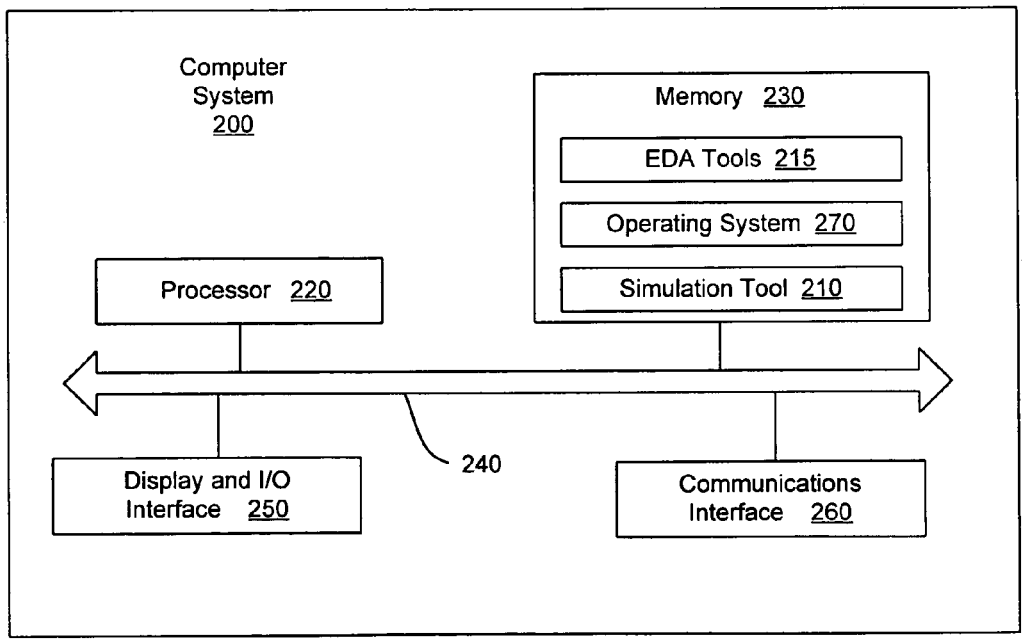
FIG. 2 is a schematic block diagram of a computer system capable of executing a simulation tool in accordance with the present invention.

Turning now to FIG. 2, a schematic block diagram of a computer system 200 capable of executing a lithography simulation tool 210 and other design processes using electronic design automation (EDA) tools 215 in accordance with the present invention is illustrated. As indicated, the simulation tool 210 is used to determine actual dimensions of device structures within a device layout, as well as variations between different structures within the device layout. In one embodiment, the simulation tool 210, is embodied as a computer program (e.g., a software application including a compilation of executable code).

To execute the simulation tool 210, the computer system 200 can include one or more processors 220 used to execute instructions that carry out a specified logic routine. In addition, the computer system 200 can include a memory 230 for storing data, software, logic routine instructions, computer programs, files, operating system instructions, and the like. The memory 230 can comprise several devices and includes, for example, volatile and non-volatile memory components. As used herein, the memory 230 can include, for example, random access memory (RAM), read-only memory (ROM), hard disks, floppy disks, compact disks (e.g., CD-ROM, DVD-ROM, CD-RW, etc.), tapes, and/or other memory components, plus associated drives and players for these memory types. The processor 220 and the memory 230 are coupled using a local interface 240. The local interface 240 can be, for example, a data bus, accompanying control bus, a network, or other subsystem.

The computer system 200 can include various video and input/output interfaces 250 as well as one or more communications interfaces 260. The interfaces 250 can be used to couple the computer system 200 to various peripherals and networked devices, such as a display (e.g., a CRT display or LCD display), a keyboard, a mouse, a microphone, a camera, a scanner, a printer, a speaker, and so forth. The communications interfaces 260 can be comprised of, for example, a modem and/or network interface card, and can enable the computer system 200 to send and receive data signals, voice signals, video signals, and the like via an external network, such as the Internet, a wide area network (WAN), a local area network (LAN), direct data link, or similar wired or wireless system.

Figure 3:
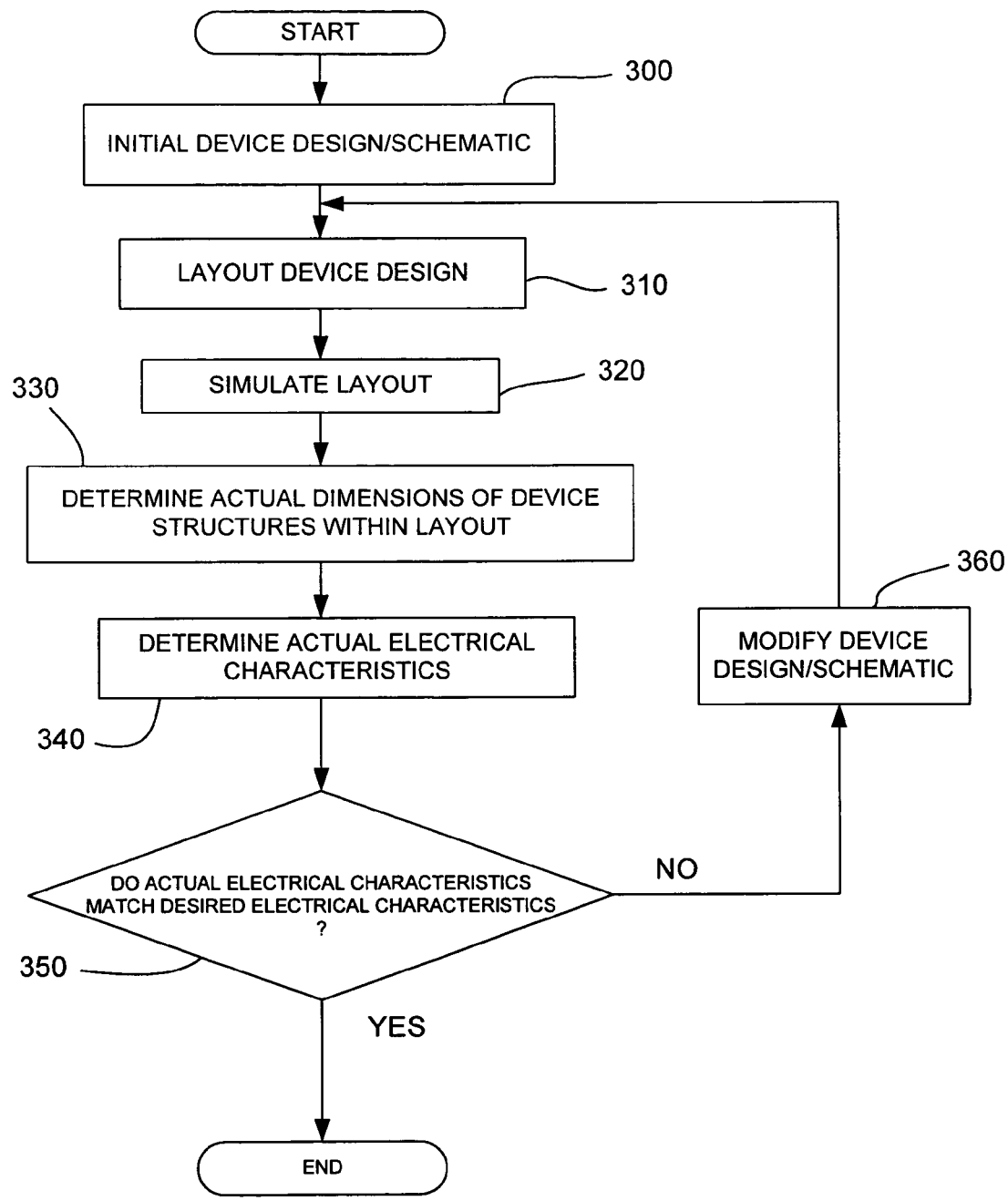
FIG. 3 is a flow chart illustrating a method of designing an integrated circuit (IC) device in accordance with one embodiment of the present invention.

The memory 230 can store an operating system 270 that is executed by the processor 220 to control the allocation and usage of resources in the computer system 200. Specifically, the operating system 270 controls the allocation and usage of the memory 230, the processing time of a processor 220 dedicated to various applications being executed by the processor 220, and the peripheral devices, as well as performing other functionality. In this manner, the operating system 270 serves as the foundation on which applications, such as the simulation tool 210, depend as is generally known by those of ordinary skill in the art With reference now to FIG. 3, one embodiment of a method for designing an integrated circuit (IC) device is provided. The flow chart of FIG. 3 can be thought of as depicting steps of a method implemented on or with the assistance of the computer system 200 of FIG. 2.

The method can begin at step 300 where an initial circuit design or schematic is provided by a designer. It is to be appreciated that, in one embodiment, exemplary IC device designs can include general use processors made from thousands or millions of transistors, a flash memory array or any other dedicated circuitry. The designer can provide or otherwise design an IC device having a desired set of performance specifications and/or electrical characteristics. The IC device design can be embodied in a high-level description, commonly referred to as a "netlist." The netlist can be described in languages such as VHDL and Verilog®, for example.

At step 310, the IC device design (typically in the form of a netlist) can be converted into a physical layout or polygonal representation. The generated layout representation can define the specific dimensions of the gates, isolation regions, interconnects, contacts, and other device elements that form the physical structures within the device design. These can be represented with polygons defining their boundaries. It is to be appreciated that the term "polygonal representation" is not limited to layouts in terms of polygons only. Rather, polygonal representations can include any curvilinear representations of a device design.

The physical layout or polygonal representation can be embodied in a layout data file or data set. The layout data set can include data layers that correspond to the actual layers to be fabricated in the IC device. The layout data file can also include cells, which define sets of particular devices within the circuit or IC device design. Cells can include all of the polygons on all of the layers required for the fabrication of the devices it contains. It is to be appreciated that cells can be nested or otherwise contained within other cells, often in very intricate arrangements. The structure of cells is commonly referred to a data hierarchy. Typical formats for the polygons of a layout are GDS II or CIF.

It is to be appreciated that, in one embodiment, the step of laying out the device design 310 can include compressing, minimizing or otherwise optimizing the size and spacing between structures within the device design.

At step 320, the layout can be simulated. In other words, the real pattern of the structures within the device design can be simulated as a result of one or more of resolution enhancement technologies (RET), optical proximity corrections (OPC), proximity to other structures, density, corner rounding, as well as any other parameters that alter the final image (i.e., the wafer image) as compared to the drawn layout or polygonal representation. The layout can be simulated using one of a variety of commercially available simulation tools, such as, for example, CALIBRE® from Mentor Graphics Corp. Such simulation tools are useful for simulating or otherwise predicting how the structures within the device design will actually pattern and/or what manufacturing defects will occur during lithographic processing.

At step 330, the designer or other operator can determine the actual dimensions of the structures within the IC device layout. This can be accomplished by using a simulation tool to better understanding how things will actually pattern on the wafer. It is to be appreciate that, the actual dimensions of structures within the device layout may pattern differently due to gate widening near polysilicon inner corners, active widening or narrowing under gates near active inner or outer corners, contact resistance between real metal shapes and real contact shapes, and the like. For example, a designer may design a device, which, when layed out, includes a transistor having a gate designed to be 500 nm by 100 nm. However, the simulation tool can reveal that the gate may pattern with dimensions of 600 nm by 120 nm due to corner rounding.

At step 340, the actual electrical characteristics associated with the IC device design can be determined. This can be accomplished using the actual dimensions of the structures within the IC device, which were determined from the simulated layout (steps 320, 330). In one embodiment, the actual electrical characteristics can be determined using a software-based or otherwise computer-implemented look-up table in which electrical characteristics are referenced with respect to device and/or structural dimensions. Alternatively, the determination of the actual electrical characteristics of the IC device design can be determined using a SPICE program or other appropriate modeling program in which structure and/or device dimensions are input. It is to be appreciated that the present invention, through the use of a simulation tool, accurately determines dimensions of devices and structures within the devices to provide the designer or other operator with the most accurate electrical model connected therewith.

At step 350, the actual electrical characteristics associated with the initial IC device design are compared to desired electrical characteristics for the device design. It is to be appreciated that the electrical characteristics can include any or all of resistance, gain, switching speed, drive current and the like. The determination of whether the actual electrical characteristics match the desired electrical characteristics can include a direct comparison between values associated with actual and desired electrical characteristics and/or a determination of whether the actual electrical characteristics are within specifications set by the designer. If it is determined that the actual electrical characteristics sufficiently match the desired electrical characteristics and/or are within the specifications set by the designer, the method illustrated in FIG. 3 ends. For example, in one embodiment, if the actual electrical characteristics are within five percent of the desired electrical characteristics and/or are within the performance specifications set by the designer, it is determined that the actual electrical characteristics sufficiently match the desired electrical characteristics.

However, if it is determined that the actual electrical characteristics do not sufficiently match the desired electrical characteristics and/or are not within the performance specifications set by the designer, the device design or schematic can be modified (step 360) in order to achieve the desired electrical characteristics and/or performance specifications and the method described above can be repeated. Alternatively, rather than modifying the device design, a designer can be provided with a more accurate understanding of the electrical characteristics associated with a particular device design and can use this information in future design considerations.

Figure 4:
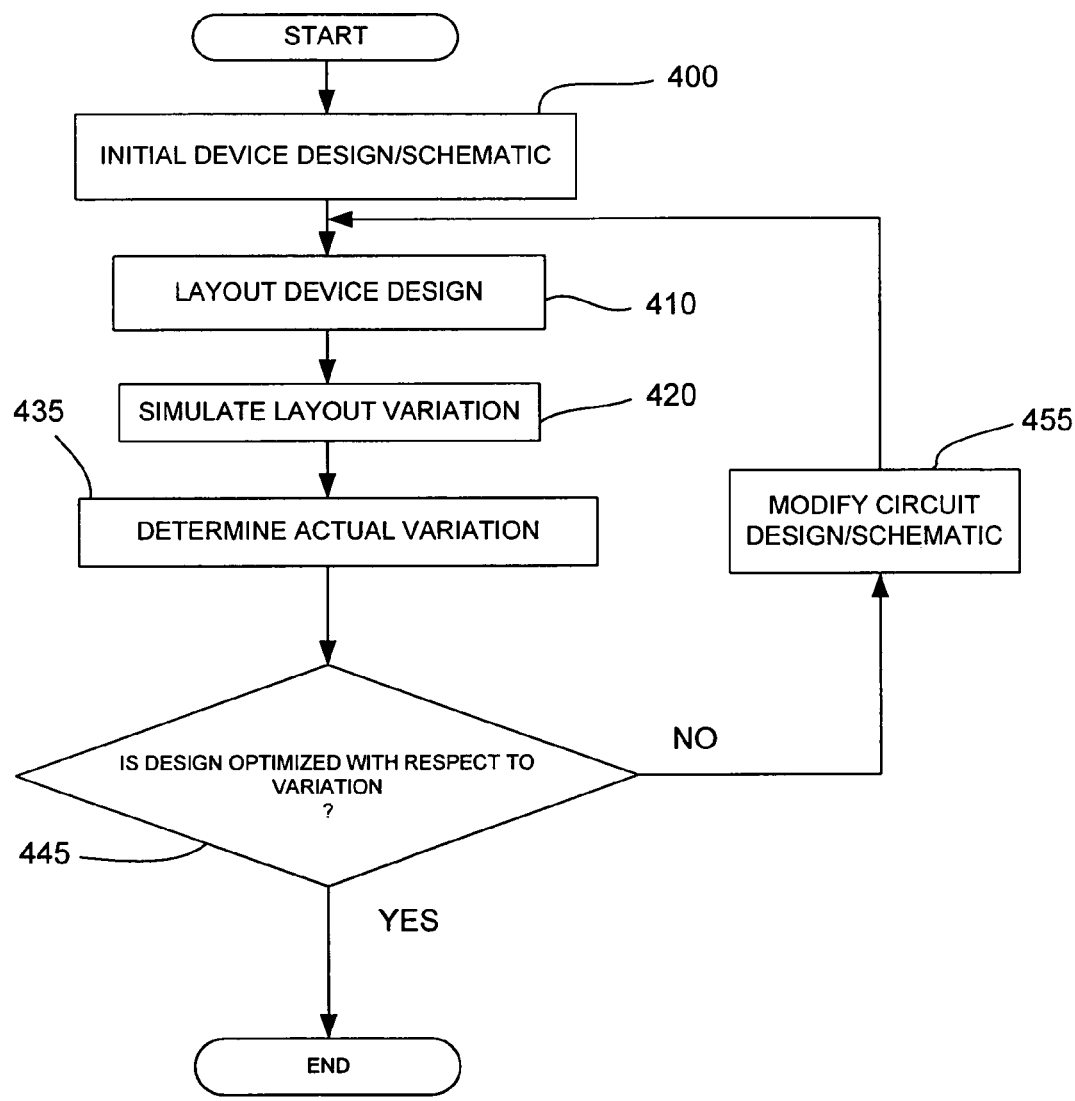
FIG. 4 is a flow chart illustrating a method of designing an IC device in accordance with another embodiment of the present invention.

With reference now to FIG. 4, another embodiment of a method for designing an integrated circuit (IC) device is provided. As discussed above with reference to FIG. 3, the flow chart of FIG. 4 can be thought of as depicting steps of a method implemented on or with the assistance of the computer system 200 of FIG. 2.

The method can begin at step 400 where an initial circuit design or schematic is provided by the designer. In some instances, the designer may want one structure or element within a cell or otherwise within the device design to have a certain relationship range to another structure or element in the cell or in another cell on a different portion of the wafer (such as, for example, gate length and width to match comparators or to set stability of latches). For example, a designer may want structure "A" to have at least 10 percent greater gain than structure "B". In prior design methodologies, a designer would use a generic variation number (related to process variation) to be sure that structure "A" has the desired relationship to structure "B". For example, the designer may design structure "A" to have at least 14 percent greater gain than structure "B" to ensure that structure "A" has at least 10 percent greater gain than structure "B". In some cases, the designer may over guardband the design to provide for worst case scenarios based on generic or typical variation numbers for process-related variation regardless of where the particular structures are located on the wafer. As discussed above, the IC device design can be embodied in a high-level netlist description.

At step 410, the IC device design (typically in the form of a netlist) can be converted into a physical layout or polygonal representation. As described above, the layout can define specific dimensions of structures within the device design, which can be represented with polygons defining their boundaries. As discussed above, the term "polygonal representation" is not limited to layouts in terms of polygons only. Rather, polygonal representations can include any curvilinear representations of a device design. The physical layout or polygonal representation can be embodied in a layout data file or data set, as described above.

At step 420, the layout and pattern variations contained therein can be simulated. The layout and pattern variations can be simulated using one of a variety of commercially available simulation tools, such as, for example, CALIBRE® from Mentor Graphics Corp. By using such a simulation tool, some or all of the parameters impacting process-related or lithography-related variation can be simulated. Parameters that impact the variation in how a structure or cell will print on the wafer include, but are not limited to, proximity to other structures and/or cells, density of structures, orientation of structures, placement, and size with respect to other structures on the same GDS level or other levels. It is to be appreciated that these variations can result from a number of factors including mask generation (including pattern write variations and stray light, resist variations, etch variations, and other parameters that contribute to critical dimension (CD) variation), wafer patterning (including write variations, exposure and focus variation, resist thickness and property variation and other parameters that contribute to CD variations), and pre-/post-patterning processing (such as etch, deposition, polish and need to take into account aspects like topography, spin coating, variations in film thickness and property variations, and other processing steps that can impact a particular layer's patterning).

At step 435, the actual variation between two or more structures within a design, can be determined based on the simulation of step 420. In other words, structures within a design can be classified based on processing and/or lithography concepts. Using this methodology, a designer can learn the actual variation of one or more structures of interest and, therefore, avoid over guard banding a design (i.e., avoid designing to a worst case scenario when that is unnecessary).

In one embodiment, steps 420 and 435 can be implemented by simulating the slopes of the illumination intensity at every edge of structures within the design. Based on a determination of the slope or logarithm of the slope, the amount of process-related variation in a particular structure can be determined. For example, with reference to FIG. 5A and FIG. 5B, exemplary plots of intensity versus the position for two edges of structures are provided. From these simulation plots, the slope or logarithm of the slope of the intensity at every edge can be determined. Based on the slope or logarithm of the slope of the intensity, the amount of process variation associated therewith can be determined.

Figure 5A:
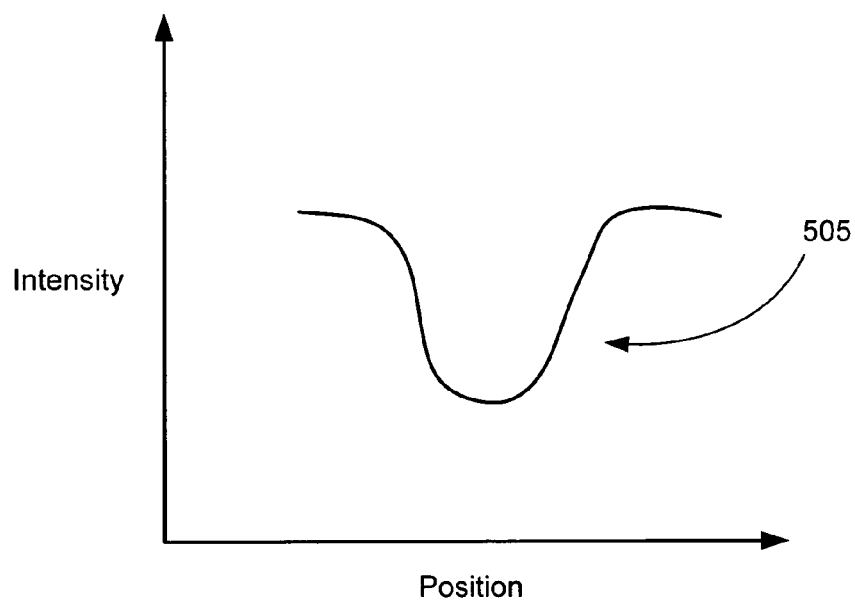
FIGS. 5A and 5B illustrate exemplary plots of intensity versus position corresponding to structure edges simulated in accordance with the present invention.
Figure 5B:
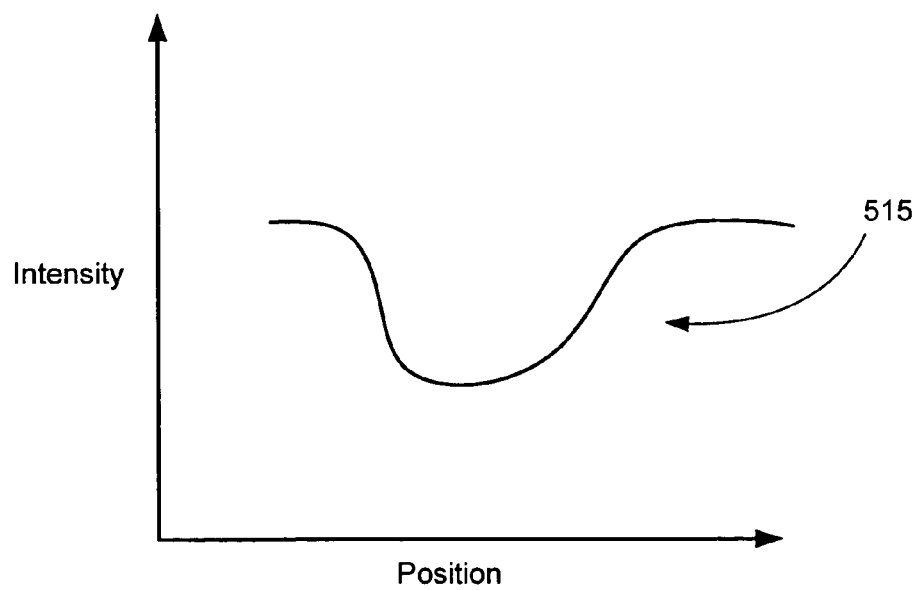

For example, the slope of the edge 505 in FIG. 5A has a much higher slope or logarithm thereof than the slope of the edge 515 shown in FIG. 5B. Based on this information, it can be determined that the edge 505 depicted in FIG. 5A can withstand much more process variation then the edge 515 depicted in FIG. 5B. In other words, a given amount of process variation will cause a relatively small change in critical dimension (CD) for the edge 505 than for the edge 515. In one embodiment, an edge having a relatively large slope will have a relatively small CD variation relative to an edge having a relatively small slope. The actual variation can be determined using a software-based or otherwise computer-implemented lookup table that references edge intensity slope and variation of process parameters.

At step 445, the actual variation between given structures is used to evaluate whether or not the overall device design or portions thereof is optimized with respect to process variation. For example, it may be determined that a certain structure built with a certain proximity to other structures and overall density may have a much smaller process variation then what was designed for (step 400) and layed out (step 410). If it is determined that the design is not optimized with respect to variation, the design can be modified appropriately at step 455. It is to be appreciated that such optimization can include adjustment of one or more of proximity to other structures and/or cells, density of structures, orientation of structures, placement, and size with respect to other structures on the same GDS level or other levels. Otherwise, the method can end.

It is to be appreciated that this methodology can provide the designer with actual variations between structures as well as guidance on how to reduce variation due to process parameters and variation in future designs. For example, this methodology can be used to instruct a designer on how to build structures and/or cells on the left and right side of a wafer to have an optimized or otherwise minimized variation. For example, a designer can be instructed that if a given structure or cell is built with a certain proximity to other structures and/or density, variation in the design due to process parameters can be lower or otherwise minimized. This will allow a design to use far less guard band and build a more optimized IC device. It is to be appreciated that while FIG. 4 has been described using slope of edge intensity as a metric for determining process-related variation, that other appropriate metrics can be employed. Other appropriate metrics can include, for example, maximum intensity in a region to be exposed away, minimum intensity in a region not to be exposed, simulated edge placement with respect to the target pattern, how movement of other edges impacts the edge being checked, and the like.

In one embodiment, any or all of the aforementioned metrics can be evaluated over a range of focus and intensity (i.e., over a process window) to determine whether an undesired effect begins to occur as the focus and intensity move away from the "best settings." In addition, one or more metrics can be evaluated over the process window at one or more other locations on the wafer.

Figure 6:
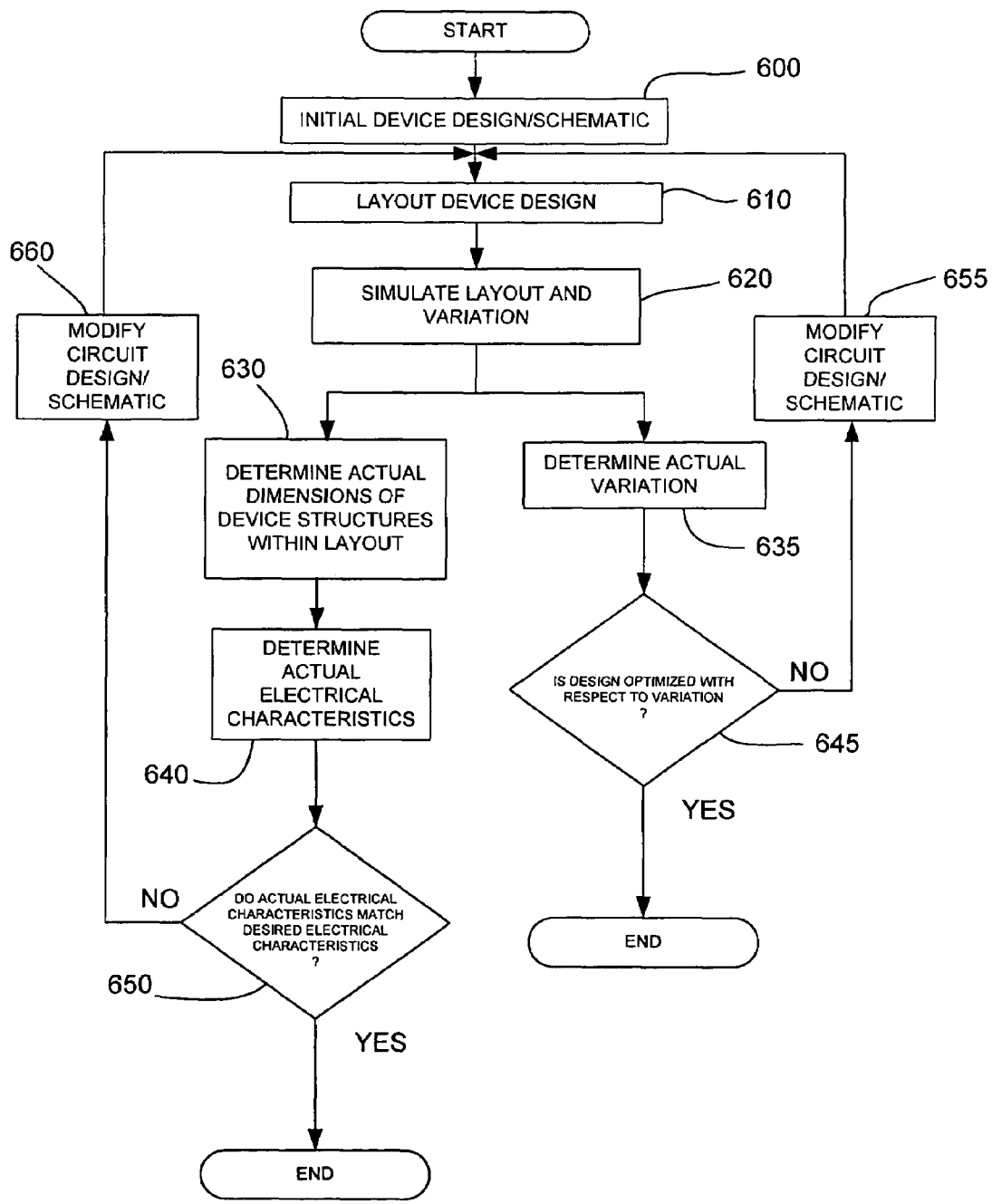
FIG. 6 is a flow chart illustrating a method of designing an IC device in accordance with another embodiment of the present invention.

With reference now to FIG. 6, another embodiment of a method for designing an IC device is provided. As discussed above, the flow chart of FIG. 6 can be thought of as depicting steps of a method implemented on or with the assistance of the computer system 200 of FIG. 2. It is to be appreciated that, in this embodiment, the method includes using a lithography simulation tool for determining the actual dimensions of device structures within a design and/or layout as well as variations between structures within the device design and/or layout.

The method can begin at step 600 where an initial circuit design or schematic is provided by a designer. As discussed above, the IC device design can be embodied in a netlist description.

At step 610, the IC device design can be converted into a physical layout or polygonal representation defining the specific dimensions of structures within the device.

At step 620, the device design layout and pattern variations contained therein can be simulated using an appropriate simulation tool. As discussed above, the simulation tool is useful for simulating or otherwise predicting how structures within the device design will actually pattern and/or what manufacturing defects may occur during lithographic processing.

This simulation data can be used to determine actual dimensions of structures within the IC device layout at step 630. In addition, at step 640, the actual electrical characteristics associated with the IC device design, as layed out, can be determined based on the actual dimensions of the structures within the IC device, which were determined based on the simulated layout. As this methodology is discussed more fully above, this description will not be repeated.

In addition, as discussed more fully with reference to FIG. 4, the actual variation between structures and/or cells within the device layout can be determined at step 635. At step 645, it can be determined whether the design is optimized with respect to pattern variations. If it is determined that the design is not optimized, appropriate modifications can be made at step 665. Similarly, at step 650, it can be determined whether the actual electrical characteristics match the desired electrical characteristics. If it is determined that the actual electrical characteristics associated with the IC device design do not sufficiently match the desired electrical characteristics, and/ or do not fall within predetermined performance specifications, appropriate modifications can be made to the device design at step 660.

Although the illustrations appended hereto show a specific order of executing functional logic blocks, the order of execution of the blocks can be changed relative to the order shown. Also, two or more blocks shown in succession can be executed concurrently or with partial concurrence. Certain blocks may also be omitted. In addition, any number of commands, state variables, warning semaphores, or messages can be added to the logical flow for purposes of enhanced utility, accounting, performance, measurement, or for providing troubleshooting aids, and the like. It is understood that all such variations are within the scope of the present invention.

Although particular embodiments of the invention have been described in detail, it is understood that the invention is not limited correspondingly in scope, but includes all changes, modifications and equivalents.

What is claimed is:

1. A method of designing an integrated circuit (IC) device having desired electrical characteristics, said method comprising:
    providing an initial IC device design;
    generating a layout representation corresponding to the initial IC device design;
    simulating how structures within the layout representation will pattern on a wafer;
    based on the simulating step, determining whether actual electrical characteristics associated with the initial IC device design sufficiently match the desired electrical characteristics,
    wherein the desired electrical characteristics include at least one of gain and switching speed; and if the actual electrical characteristics associated with the initial IC device design do not sufficiently match the desired electrical characteristics, modifying the initial IC device design;
    wherein the initial IC device design includes a desired relationship between at least two structures within the IC device design;
    further comprising:
    determining an amount of process-related variation associated with at least two structures within the layout representation of the IC device design;
    wherein determining an amount of process-related variation associated with at least two structures within the layout representation includes:
    simulating how structures within the layout representation will pattern on a wafer; and
    measuring a feature of the simulated structures, said feature being indicative of process-related variation;
    wherein the feature indicative of process-related variation is at least one of (i) slope of edge intensity and (ii) logarithm of slope of edge intensity; and
    wherein: a larger slope of edge intensity or logarithm of slope of edge intensity is indicative of a smaller process-related variation; and a smaller slope of edge intensity or logarithm of slope of edge intensity is indicative of a larger process-related variation.

2. The method of claim 1, further comprising:
    providing feedback to a designer regarding how a given structure will print on a wafer as a function of at least one of (i) proximity of a structure to other structures, (ii) density of structures within a portion of the IC device design, (iii) orientation of a structure, (iv) placement of a structure within a portion of the IC device design, and (v) size of a structure with respect to other adjacent structures.

* * * * *